United States Patent [19]
Achiwa

[11] Patent Number: 4,949,223
[45] Date of Patent: Aug. 14, 1990

[54] ELECTRONIC COMPONENT ENCAPSULATED IN A PACKAGE AND ELECTRONIC APPARATUS USING THEREOF

[75] Inventor: Masayoshi Achiwa, Ohtsu, Japan
[73] Assignee: Matsushita Electronics Corporation, Osaka, Japan
[21] Appl. No.: 373,201
[22] Filed: Jun. 30, 1989

[30] Foreign Application Priority Data
Jun. 30, 1988 [JP] Japan ............................... 63-160642

[51] Int. Cl.⁵ .............................................. H01R 9/00
[52] U.S. Cl. ...................................... 361/408; 357/65; 357/68; 361/400; 361/405
[58] Field of Search .................... 174/52.4; 357/65-70, 357/80; 361/400, 403-406, 408, 421

[56] References Cited
U.S. PATENT DOCUMENTS
4,482,781 11/1984 Burns .................................. 174/52.4
4,673,967 6/1987 Hingorany .......................... 361/403
4,827,611 5/1989 Pai et al. ............................. 361/405

FOREIGN PATENT DOCUMENTS
0218150 9/1986 Japan ..................................... 357/70

Primary Examiner—Gregory D. Thompson
Attorney, Agent, or Firm—Wenderoth, Lind & Ponack

[57] ABSTRACT

The present invention is drawn to an electronic component in the form of a packaged semiconductor device or the like, and an electronic apparatus using the same, in which protrusions having a semicircular cross section are formed along the sides of the lower surface of the package, leads of the component include a first curved portion conformed to the contour of a protrusion, a second curved portion conformed to the lower surface of the first curved portion and a linking portion coupling the first and second curved portions. The leads project from the side of the package, and the lower surface of the second curved portion is soldered to the wiring pattern on a printed circuit board. With this structure, if the electronic component becomes defective, the package can be lifted from the surface of the printed circuit board by stretching the external leads, and the solder can be removed very easily. Accordingly, even if multiple electronic components are densely mounted on the printed circuit board, an individual defective electronic component can be easily replaced.

8 Claims, 2 Drawing Sheets

ELECTRONIC COMPONENT ENCAPSULATED IN A PACKAGE AND ELECTRONIC APPARATUS USING THEREOF

BACKGROUND OF THE INVENTION

This invention relates to electronic components such as semiconductor devices.

Recently, in response to the demand for compact and light electronic appliances, there is a strong trend of miniaturizing electronic components incorporated in electronic appliances. Generally, electronic components are mounted on a printed circuit board disposed within an electronic appliance. More lately, in particular, in order to increase the mounting density of electronic components on the printed circuit board, the electronic components are often affixed to both sides of the printed circuit board by soldering, or so-called surface mounting is widely employed.

Incidentally, a semiconductor device is one of such electronic components usually encapsulated in a resin package. Often used as the package of the semiconductor device to be surface mounted on a printed circuit board is the small-outline "J" lead package (referred to as SOJ package hereinafter).

In FIGS. 2(A), (B), a semiconductor device encapsulated in a conventional SOJ package is shown.

In the figures, a semiconductor chip (not shown) is encapsulated in a resin package 1 having a substantially rectangular parallelepiped shape. At the lower surface of the package 1, nearly semicircular protrusions 2 extend along the sides thereof. A part of a lead frame electrically connected to the semiconductor chip projects from both sides of the package 1 as plural external leads 7. Each external lead 7 is bent to a J-shape to cover the protrusions 2 by conforming to the contour of the protrusions 2 of the package.

When mounting a semiconductor device encapsulated within a thus composed SOJ package on a printed circuit board, as shown in FIG. 2(B), each external lead 7 is positioned on the wiring pattern 5 of the printed circuit board 4, and the semiconductor device is temporarily fixed on the surface of the printed circuit board 4. Afterwards, by employing the so-called dip method of passing the printed circuit board 4 through a solder bath, or by employing the so-called reflow method of heating and melting the solder by infrared rays, the solder 6 is melted, and the external leads 7 are connected to the wiring pattern 5 of the printed circuit board 4.

Thus, in the SOJ package, since the external leads 7 are formed in a state tightly contacting with side and lower surfaces of the package 1, when the semiconductor device is mounted on the printed circuit board 4, the space occupied by the semiconductor device is minimized in both the vertical and the lateral directions, so that a high mounting density may be realized.

The semiconductor device encapsulated in the SOJ package is mounted on both sides of the printed circuit board together with other small electronic components. However, the semiconductor chip may be broken in the course of long use or due to some other cause. In such a case, the semiconductor device must be replaced with a normal one. In the SOJ package, however, the soldered parts are located beneath the package 1. Still further, various electronic components are densely mounted on both sides of the printed circuit board. It is accordingly extremely difficult to simultaneously melt the solder of the multiple external leads of the defective semiconductor device to detach the semiconductor device from the printed circuit board. If it is attempted to remove the semiconductor device from the printed circuit board by force, the adjacent electronic components may be broken. Furthermore, even if the defective semiconductor device can be dismounted from the printed circuit board, it is next to impossible to solder a normal semiconductor device in its place.

Therefore, hitherto, if the semiconductor device in the SOJ package became defective, it was required to replace the expensive printed circuit board having multiple electronic components assembled thereto in order to repair the electronic appliance.

SUMMARY OF THE INVENTION

It is hence a primary object of the invention to provide an electronic component encapsulated in a package which can facilitate a high mounting density as can the conventional SOJ package, and can be easily detached from the printed circuit board in the event of trouble or the like wherein a normal package can easily be mounted in its place.

In short, this invention comprises a folded portion of an external lead projecting from the package.

More specifically, the external leads are folded so that the electronic components can be soldered on the printed circuit board as in the conventional SOJ package, and yet the electronic components can be easily detached from the printed circuit board when the folded external leads are stretched out.

Other objects of the invention will be better understood and appreciated from the following detailed description taken in conjunction with the drawings.

DETAILED DESCRIPTION OF THE PREFERRED EMBODIMENT

Figure 1A:
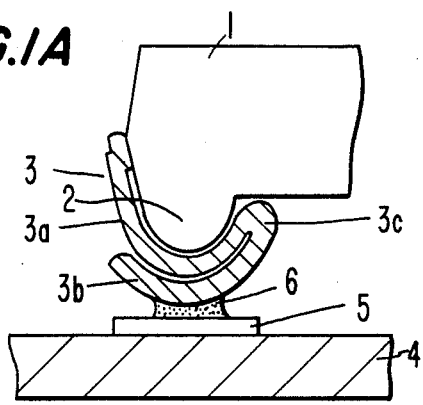
FIG. 1(A) is a sectional view of an external lead of an electronic component in a folded state according to a preferred embodiment of the invention.

Referring now to FIGS. 1(A), (B), a preferred embodiment of the invention is described in detail below.

Figure 2A:
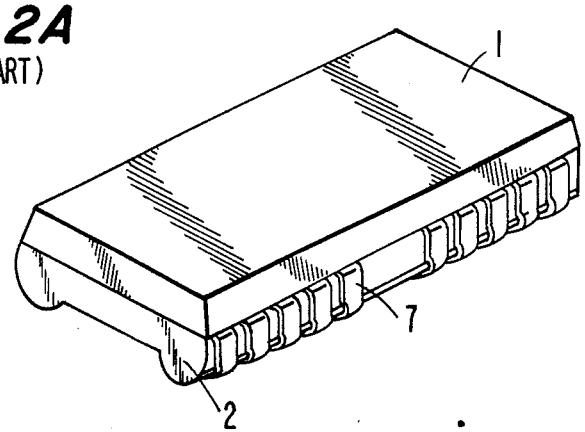
FIG. 2(A) is a perspective view of a conventional SOJ package.

In the drawing, a package 1 made of resin has a rectangular parallelepiped shape similar to that of the conventional package 1 shown in FIG. 2(A). At both sides of the lower surface of the package 1, nearly semicircular protrusions 2 are integrally formed and extend along the edges of the package. A part of the lead frame electrically connected to an electric element or circuit such as a semiconductor chip (not shown) in the package 1 projects from both sides of the package 1 as plural external leads 3. Each external lead 3 is bent into a shape that substantially covers the protrusions 2.

The shape of the external lead 3 will now be described in detail. The external lead 3 is made of copper having a thickness of about 0.2 mm, and consists of a first curved portion 3a bent tightly in conformance with the contour of the protrusion 2 of the package 1, a second curved portion 3b bent tightly along the lower surface of the first curved portion 3a, and a linking portion 3c coupling the first and second curved portions 3a, 3b.

In the embodiment shown in FIG. 1(A), upon the completion of the fabrication of the semiconductor device, the external lead 3 is bent into the shape shown in FIG. 1(A). That is, lead 3 is bent to form the first curved portion 3a closely conforming to the contour of the protrusion 2 of the package 1, and the lead 3 is bent about 180 degrees inside of the protrusion 2 of the package 1 to form linking portion 3c, and finally, the lead 3 is again bent so as to form curved portion 3b closely conforming to the lower surface of the first curved portion 3a.

Therefore, as shown in FIG. 1(A), with the protrusion 2 of the package 1 positioned on the wiring pattern 5 of the printed circuit board 4, when the package 1 is provisionally fixed on the printed circuit board 4, and the solder 6 is melted by employing a dip method or a reflow method and is then hardened, the package 1 is mounted on the printed circuit board 4.

Figure 2B:
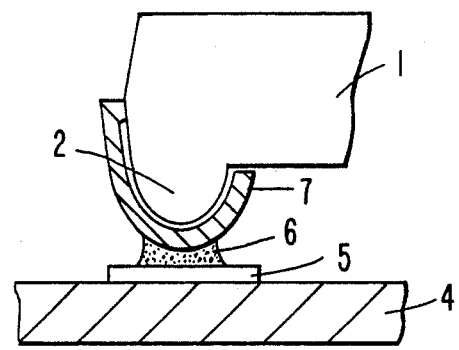
FIG. 2(B) is a sectional view of a conventional SOJ package soldered to a printed circuit board.

The linking portion 3c of the external lead 3 is positioned in the dead space inside of the protrusion 2. Therefore, the curvature of the linking portion 3c hardly contributes to the height of the package 1 from the printed circuit board 4. Moreover, the second curved portion 3b is in contact with the lower surface of the first curved portion 3a to a degree at which there is almost no gap between the first and second curved portions 3a, 3b. Therefore, as is clear from a comparison between FIG. 1(A) and FIG. 2(B), the mounting position of the package 1 according to the present invention is higher only by the thickness (in this embodiment, about 0.2 mm) of the second curved portion 3b, as compared to the mounting position of the conventional package 1. Furthermore, since the first curved portion 3a tightly contacts the side surface of the package 1, it is substantially the same as the conventional external lead 7 shown in FIG. 2, and space in the lateral direction is hardly needed to facilitate the mounting of package 1 on circuit board 4. Therefore, when the package 1 is mounted on the printed circuit board 4 as shown in FIG. 1(A), the space occupied by the device can be kept to a minimum in both the vertical and lateral directions, so that a high mounting density as in the prior art can be realized.

Meanwhile, in the state shown in FIG. 1(A), the tip of the second curved portion 3b is located near the middle of the first curved portion 3a. By providing the second curved portion 3b with such a length, the adhering area of the solder 6 may be sufficiently wide, and the adhesion strength can be increased.

On the other hand, when replacing the device once mounted on the printed circuit board 4, the following procedure is used.

Figure 1B:
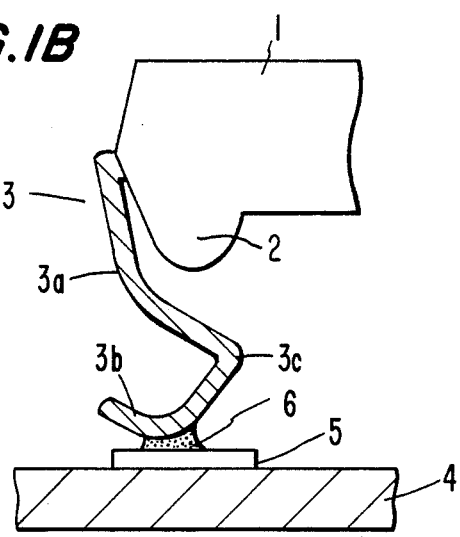
FIG. 1(B) is a sectional view of the external lead of the electronic component in a stretched stated according to the same embodiment.

First, the defective device is taken out of the printed circuit board 4. As shown in FIG. 1(B), the package 1 is lifted up from the printed circuit board 4. As a result, the first curved portion 3a of the external lead 3 is bent away from the protrusion 2 of the package 1 and is stretched, and then the linking portion 3c is bent nearly to 90 degrees, as the package 1 is easily lifted from the surface of the printed circuit board 4. Thus, the solder 6 deposited below the plural external leads 3 may be individually melted and the external lead 3 may be cut off extremely easily.

Then a normal device is remounted on circuit board 4. The folded external lead 3 as shown in FIG. 1(A) is preliminarily stretched out as shown in FIG. 1(B), and the second curved portion 3b is connected to the wiring pattern 5 with solder 6. Afterwards, the package 1 is pushed down from above, and the linking portion 3c is bent nearly 180 degrees. And, subsequently, the first curved portion 3a is bent to conform to the contour of the protrusion 2 as shown in FIG. 1(A). In this way, the device 1 is replaced easily. Further, although, due to the plastic deformation of the external lead 3, the external lead 3 of the replacement device is slightly higher than was the external lead 3 of the replaced device before replacement, such does not matter practically.

In this embodiment, a semiconductor device has been discussed as an example of an electronic component, but the invention may be applied to any other component as long as an electric element or circuit can be encapsulated in the component and an external lead projects therefrom.

I claim:

1. An electronic component comprising:
an electric element or circuit;
a package in which said electric element or circuit is encapsulated, said package having sides and a lower surface extending between said sides, and said package defining protrusions extending longitudinally along said lower surface adjacent the sides of the package, said protrusions each having a generally semi-circular cross section; and
a plurality of conductive and flexible external leads electrically connected to said electric element or circuit encapsulated in said package and projecting from the sides of said package;
each of said leads including a first curved portion substantially covering a cross sectional portion of the protrusion adjacent thereto and conformed to the contour thereof, a second curved portion superposed with and conformed to the contour of said first curved portion, and a linking portion extending between and coupling ends of said first and said second curved portions, said first curved portion being bendable away from said second curved portion about said linking portion in each said lead.

2. An electronic component as claimed in claim 1, wherein said linking portion of each lead is disposed adjacent an inner surface of a respective protrusion, said inner surface defined inwardly of the component with respect to the longitudinal direction along which the respective protrusion extends.

3. An electronic component as claimed in claim 1, wherein said second curved portion has a terminal free end disposed adjacent the middle of said first curved portion.

4. An electronic component as claimed in claim 1, wherein said package has the shape of a substantially rectangular parallelepiped, and said protrusions extend adjacent opposed sides of the package, respectively.

5. An electronic apparatus comprising:
an electronic component including an electric element or circuit, a package in which said electric element or circuit is encapsulated, and a plurality of conductive and flexible external leads electrically connected to said electric element or circuit encapsulated in said package,
said package having sides and a lower surface extending between said sides, and said package defining protrusions extending longitudinally along said lower surface adjacent the sides of the package, said protrusions each having a generally semi-circular cross section, said leads projecting from the sides of said package and each of said leads including a first curved portion substantially covering a cross sectional portion of the protrusion adjacent thereto and conformed to the contour thereof, a second curved portion superposed with and conformed to the contour of said first curved portion, and a linking portion extending between and coupling ends of said first and said second curved portions;

a printed circuit board having a wiring pattern thereon extending at locations aligned with the external leads of said electronic component;

solder extending between and connecting the second curved portion of each of said leads and the wiring pattern of said printed circuit board; and said first curved portion being bendable away from said second curved portion about said linking portion in each said lead.

6. An electronic apparatus as claimed in claim 5, wherein said linking portion of each lead is disposed adjacent an inner surface of a respective protrusion, said inner surface defined inwardly of the component with respect to the longitudinal direction along which the respective protrusion extends.

7. An electronic apparatus as claimed in claim 5, wherein said second curved portion has a terminal free end disposed adjacent the middle of said first curved portion.

8. An electronic apparatus as claimed in claim 5, wherein said package has the shape of a substantially rectangular parallelepiped, and said protrusions extend adjacent opposed sides of the package, respectively.

* * * * *